United States Patent
Vicard

(10) Patent No.: US 8,375,563 B2
(45) Date of Patent: Feb. 19, 2013

(54) METHOD FOR MAKING AN ASSEMBLY OF CHIPS BY MEANS OF RADIOFREQUENCY TRANSMISSION-RECEPTION MEANS MECHANICALLY CONNECTED BY A RIBBON

(75) Inventor: Dominique Vicard, Saint-Nazaire-les-Eymes (FR)

(73) Assignee: Commissariat a l'Energie Atomique et aux Energies Alternatives, Paris (FR)

( * ) Notice: Subject to any disclaimer, the term of this patent is extended or adjusted under 35 U.S.C. 154(b) by 0 days.

(21) Appl. No.: 13/140,888

(22) PCT Filed: Dec. 21, 2009

(86) PCT No.: PCT/FR2009/001469
§ 371 (c)(1), (2), (4) Date: Jun. 20, 2011

(87) PCT Pub. No.: WO2010/072921
PCT Pub. Date: Jul. 1, 2010

(65) Prior Publication Data
US 2011/0247198 A1    Oct. 13, 2011

(30) Foreign Application Priority Data
Dec. 22, 2008 (FR) ...................................... 08 07332

(51) Int. Cl.
*H01P 11/00* (2006.01)
(52) U.S. Cl. ............. 29/601; 29/592.1; 29/840; 29/846; 438/123
(58) Field of Classification Search ................ 29/592.1, 29/593–594, 600, 830–834, 840–842; 257/E21, 257/784; 438/113, 464; 156/584
See application file for complete search history.

(56) References Cited

U.S. PATENT DOCUMENTS

| | | | | |
|---|---|---|---|---|
| 4,688,150 | A * | 8/1987 | Peterson | 361/771 |
| 4,962,415 | A * | 10/1990 | Yamamoto et al. | 257/679 |
| 6,574,858 | B1 * | 6/2003 | Hembree | 29/827 |
| 6,800,018 | B2 * | 10/2004 | Tricard et al. | 451/28 |
| 7,117,587 | B2 * | 10/2006 | Chen et al. | 29/827 |
| 7,129,118 | B2 * | 10/2006 | Yoo et al. | 438/113 |
| 7,745,253 | B2 * | 6/2010 | Luechinger | 438/106 |

(Continued)

FOREIGN PATENT DOCUMENTS

| | | |
|---|---|---|
| EP | 1 069 645 A2 | 1/2001 |
| EP | 1 630 728 A1 | 3/2006 |

(Continued)

OTHER PUBLICATIONS

International Search Report issued in International Application No. PCT/FR2009/001469 on May 7, 2010 (with translation).

*Primary Examiner* — Minh Trinh
(74) *Attorney, Agent, or Firm* — Oliff & Berridge, PLC

(57) ABSTRACT

A method for making an assembly of chips equipped with radiofrequency transmission-reception means, including successively: making a plurality of chips, on a substrate, each chip having at least one reception area, connecting the reception areas of the chips of the assembly in series with an electrically insulating flat ribbon having a plurality of metallic patterns electrically insulated from one another, each pattern forming at least a part of a flat antenna electrically connected at the level of at least one connection area of the antenna to a corresponding reception area, and separating the chips at the level of the substrate, the chips being mechanically connected to one another by the ribbon.

12 Claims, 4 Drawing Sheets

U.S. PATENT DOCUMENTS

| | | |
|---|---|---|
| 2003/0136503 A1 | 7/2003 | Green et al. |
| 2004/0217488 A1* | 11/2004 | Luechinger .................. 257/784 |
| 2007/0146135 A1 | 6/2007 | Boyadjieff et al. |
| 2007/0148981 A1 | 6/2007 | Rogge |
| 2011/0247198 A1* | 10/2011 | Vicard ........................... 29/601 |

FOREIGN PATENT DOCUMENTS

EP  1 788 514 A1  5/2007

* cited by examiner

METHOD FOR MAKING AN ASSEMBLY OF CHIPS BY MEANS OF RADIOFREQUENCY TRANSMISSION-RECEPTION MEANS MECHANICALLY CONNECTED BY A RIBBON

BACKGROUND OF THE INVENTION

The invention relates to a method for making an assembly of chips equipped with radiofrequency transmission-reception means.

STATE OF THE ART

Microelectronic chips equipped with radiofrequency transmission-reception means can act as electronic RFID tags. These chips are then provided with antennas and can be used for remote identification of objects.

The conventional applications of such tags are stock management and traceability. The active part of these chips is generally highly miniaturized, i.e. they can have sides smaller than 400 µm. In spite of this miniaturization, these chips require an antenna the dimensions of which are of the order of magnitude of the wavelength corresponding to the operating frequency of the chips. Conventionally, the active parts of a RFID tag are made on a silicon wafer, each chip then being diced to separate it from the other chips present on the wafer. The chip is then placed on a printed circuit containing the antenna necessary for the RFID tag to operate. The antenna is generally made in the form of a metal track printed on a substrate.

In certain applications, RFID chips can be integrated in fibers to form a paper sheet. The chip then has to be relatively thin, with a thickness of about 25 µm (the chip and its associated antenna). For such a thickness, current techniques of transferring the chip onto its antenna are not very dependable, the probability of breakage or damage to the chip being high.

OBJECT OF THE INVENTION

The object of the invention is to provide a method for making chips mechanically connected to one another in flexible manner that does not present the shortcomings of the prior art.

This object is achieved by the appended claims and more particularly by the fact that the method successively comprises:
  making a plurality of chips, on a substrate, each chip comprising at least one reception area,
  connecting the reception areas of the chips of the assembly in series by means of an electrically insulating flat ribbon comprising a plurality of metallic patterns electrically insulated from one another, each pattern forming at least a part of a flat antenna electrically connected via at least one connection area of said antenna to a corresponding reception area,
  separating the chips at the level of the substrate, said chips being mechanically connected to one another by said ribbon.

BRIEF DESCRIPTION OF THE DRAWINGS

Other advantages and features will become more clearly apparent from the following description of particular embodiments of the invention given for non-restrictive example purposes only and represented in the appended drawings, in which.

DESCRIPTION OF PREFERRED EMBODIMENTS OF THE INVENTION

Figure 1:
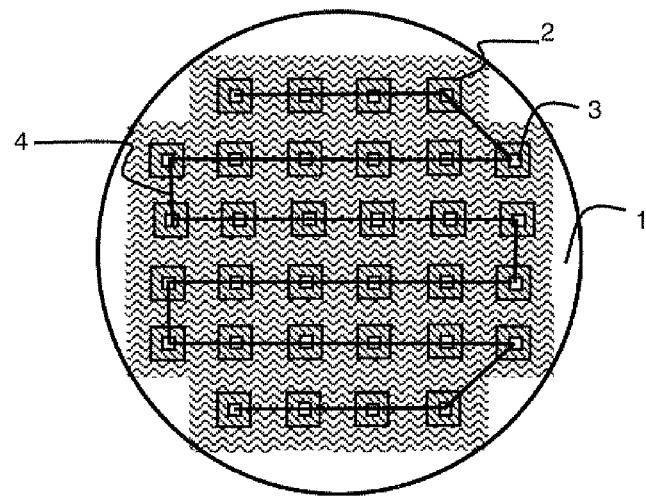
FIG. 1 illustrates a top view of a substrate comprising the chips necessary for performing the method.
Figure 2:
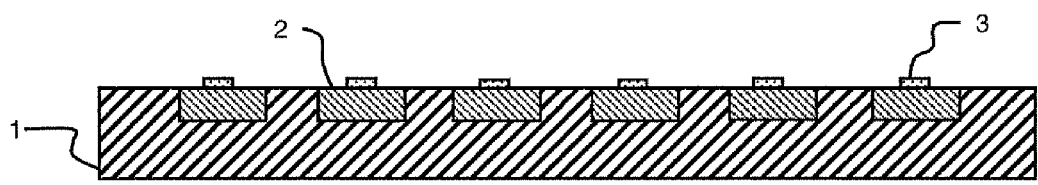
FIGS. 2, 3 and 4 illustrate a cross-sectional view of the substrate of FIG. 1 according to the different steps of a first embodiment of the method.
Figure 3:
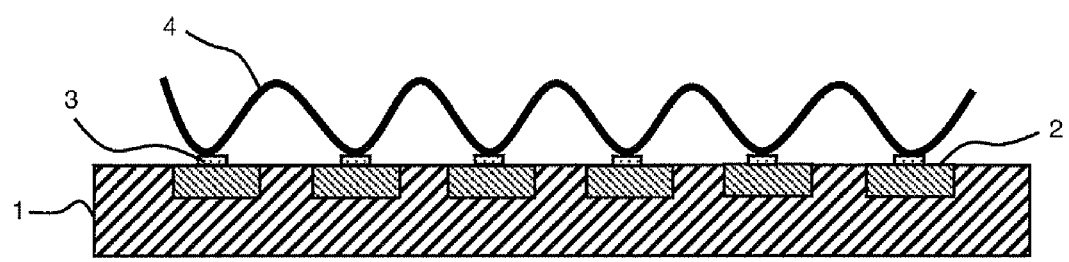

As illustrated in FIGS. 1 to 3, a plurality of microelectronic chips 2 equipped with radiofrequency transmission-reception means designed to form RFID tags are made on a substrate 1, which can be a silicon substrate. The chips can be identical or not. Each chip 2 comprises at least one reception area 3. After the plurality of chips 2 have been made on the substrate, they are connected in series at the level of reception areas 3 (FIG. 1) by a ribbon 4 before being separated at the level of substrate 1. After they have been separated, the chips are mechanically connected to one another by a ribbon as illustrate in FIG. 4.

When the chips are made on a substrate 1, they can be arranged in the form of rows, the substrate then comprising a plurality of rows of chips substantially parallel to one another. Ribbon 4 can connect the chips of the same row of chips in series, but it is also in the same way possible to connect an adjacent row with a different ribbon 4 or with the same ribbon 4 as in FIG. 1. The width of ribbon 4 is preferably determined so that there is no overlap between two adjacent portions of ribbon 4 each associated with a row of chips once the portions of ribbon have been secured to the corresponding reception areas 3. When ribbon 4 is placed on the mid-line of a row of chips, ribbon 4 has a maximum width equal to the width of the row, perpendicularly to the longitudinal axis of ribbon 4, plus the distance separating two rows of chips. The above-mentioned overlap is thereby prevented.

Figure 5:
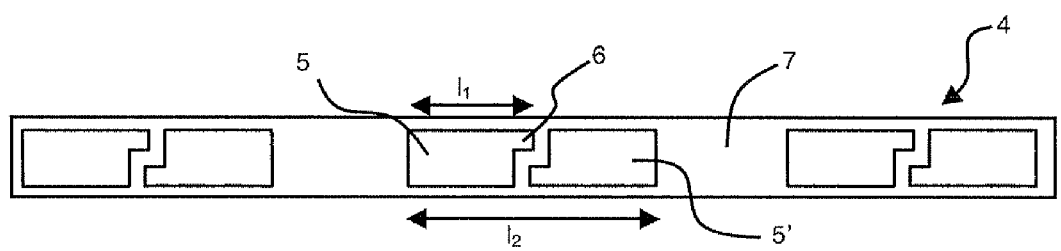
FIG. 5 illustrates a particular embodiment of a ribbon designed to connect the chips of the substrate.

The ribbon connecting chips 2 in series at the level of reception areas 4 is an electrically insulating flat ribbon 4. This ribbon 4 can be a wire or a polymer film of rectangular cross-section. The polymer used is preferably polyester. As illustrated in FIG. 5, ribbon 4 comprises a plurality of metallic patterns 5 electrically insulated from one another. Each pattern 5 forms at least a part of a flat antenna. This antenna is preferably made on the ribbon, i.e. it is coplanar with ribbon 4.

The flat antenna is designed to be electrically connected in a step of series connection to the chips. This connection is made at the level of at least one connection area 6 of said antenna to a reception area 3 of a corresponding chip 2. The particular embodiment of FIG. 5 is a ribbon designed to form a dipolar antenna at the level of each chip 2. An antenna according to FIG. 5 is thus composed of two metallic patterns 5 and 5' electrically insulated from one another. The ribbon comprises a plurality of antennas separated from one another by an inter-antenna space 7. Two adjacent patterns forming an antenna each comprise a connection area 6 designed to respectively electrically connect two reception areas 3 and 3' of the same chip 2 as in FIG. 6. The length $l_1$ of the patterns is chosen so as to suit the desired length of the antenna associated with the chip containing the radiofrequency transmission-reception means. The total length $l_2$ of the two patterns 5 and 5' along the longitudinal axis of ribbon 4 is about λ/2, where λ represents the wavelength of the central frequency of the transmission-reception band.

Figure 6:
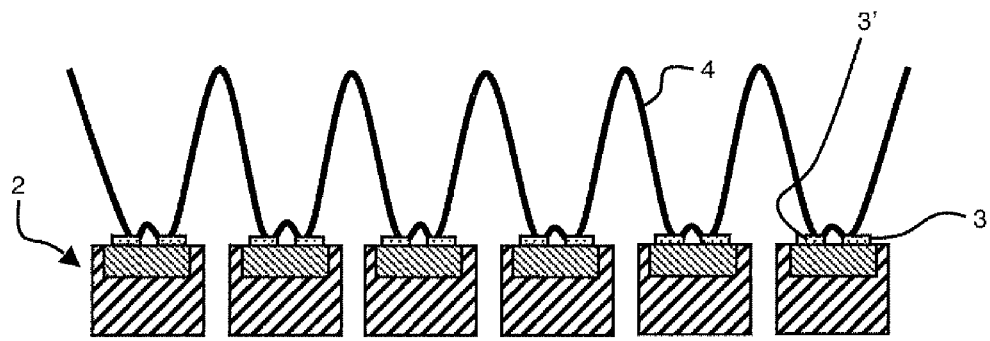
FIG. 6 illustrates a variant of the assembly using the ribbon illustrated in FIG. 5.

As in FIG. 6, ribbon 4 is able to stretch vertically with respect to the substrate, for example according to the length of inter-antenna space 7, and forms for example a half-loop between two adjacent chips. This vertical stretching can be performed in the step of series connection of the chips, for example after connection of ribbon 4 on a first chip and before connection of ribbon 4 on reception area 3 of the adjacent chip.

Inter-antenna space 7 can be determined according to the type of application. For example purposes, larger lengths of connecting inter-antenna space 7 are desirable to subsequently enable storage of the chips, for example in the form of a reel or a roll. The ribbon is therefore preferably flexible to allow modulation of the length of inter-antenna space 7 and storing in the form of a reel or roll.

Thus, when the chips are connected in series by a ribbon 4 at the level of substrate 1, vertical stretching of ribbon 4 with respect to substrate 1 enables any type of spacing between two chips of a roll to be achieved. In other words, when series connection of reception areas 3 of two adjacent chips is performed, ribbon 4 is stretched vertically with respect to the substrate between the two adjacent chips so that, after the chips have been separated, the two adjacent chips are separated by a predetermined distance.

For example purposes, patterns 5 are achieved by a metallic deposition on a surface of ribbon 4, and this deposition is then patterned by chemical etching or by local ablation of the metallic deposition or by any other method known to the person skilled in the art. Any type of antenna can be produced according to this method. The size and shape of the pattern or patterns forming an antenna are adapted to suit the transmission-reception means of the chip to be connected and/or use of the RFID tag. The patterns can be made from copper or from aluminum.

The series connection step of chips 2 can be performed by unrolling the ribbon above the chips (FIG. 1) and by marking each connection area 6 of the corresponding antenna to reception area 3 of chip 2 to be connected. Each connection area 6 is in this way placed facing the corresponding reception area 3 before bonding or ultrasonic welding. To facilitate this marking, ribbon 4 is preferably transparent. Transparency of the ribbon enables marking to be perform optically in order to locate each connection area 6 facing the corresponding reception area 3. Once connection area 6 has been placed in contact with corresponding reception area 3, the two areas are then electrically and mechanically secured to one another by any type of technique that the person skilled in the art is liable to use taking account of the properties of ribbon 4 and of metallic patterns 5 (temperature constraints on the material of the ribbon, stresses etc.). For example purposes, securing can be performed by bonding (electrically conducting adhesive) or by ultrasonic welding. Ribbon 4 is preferably ensuring contact between connection area 6 and reception area 3 and an ultrasonic vibration is then exerted to perform welding. When a chip comprises two reception areas 3 (FIG. 6), connection areas 6 of the associated antenna can be secured concomitantly.

The connection step is performed at the level of each chip 2. The substrate comprising chips 2 is preferably associated with a correspondence table of the defects determined in an electrical testing step during fabrication of chips 2. Certain defective chips can thereby be ignored by not incorporating them in the assembly if the inter-antenna space enables the next functional chip to be connected.

Figure 4:
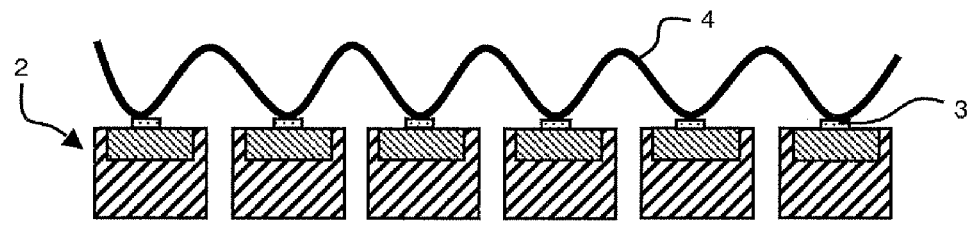

As illustrated in FIG. 4, the substrate is then patterned so as to separate the chips from one another at the level of the substrate. The chips are then connected in series solely by a flexible mechanical connection by means of ribbon 4. Separation of chips 2 is performed in the case of a bulk substrate 1 in conventional manner, for example by dicing, taking care not to cut ribbon 4 and not to damage the antennas.

Such a method facilitates fixing between the ribbon and the plurality of chips as all the chips are initially secured to the same rigid support constituted by the substrate. This operation is then similar to the techniques conventionally used in the microelectronics industry.

Figure 7:
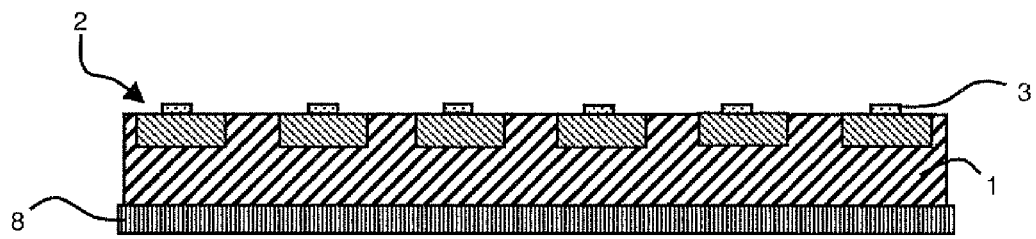
FIGS. 7, 8 and 9 illustrate a second embodiment of the assembly method.
Figure 8:
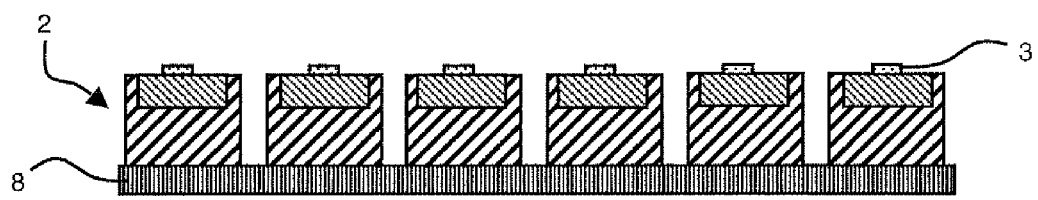
Figure 9:
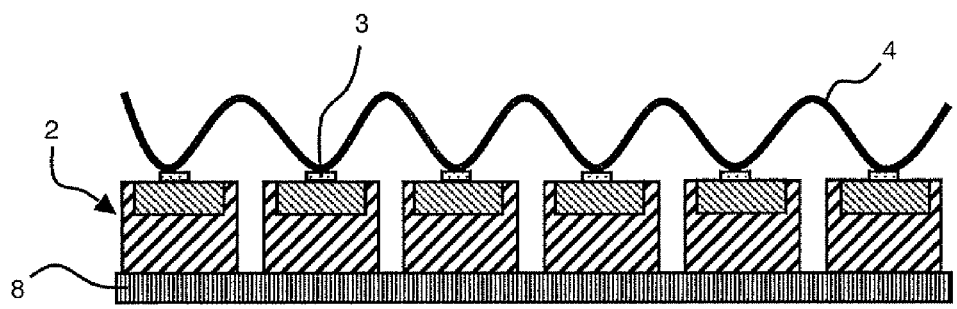

In a second embodiment illustrated in FIGS. 7 to 9, substrate 1 comprises a provisional support 8 forming a maintaining film (FIG. 7). This provisional support 8 is initially deposited on the surface of substrate 1 opposite that comprising chips 2. As illustrated in FIG. 8, chips 2 are separated from one another by partial slicing up to provisional support 8. Chips 2 therefore remain mechanically secured to one another at the level of substrate 1 by means of provisional support 8. This partial separation of the chips is performed by any suitable method, for example by dicing or by plasma etching.

As illustrated in FIG. 9, ribbon 4 is then, as before, fixed to each of chips 2 at the level of each reception area 3 taking care to arrange connection area or areas 6 of the antenna, associated with chip 2, facing the corresponding reception area or areas 3 before making the electric connection. Provisional support 8 is then removed and the chips are then only connected to one another by means of the flexible mechanical connection formed by ribbon 4 (FIG. 4).

Figure 10:
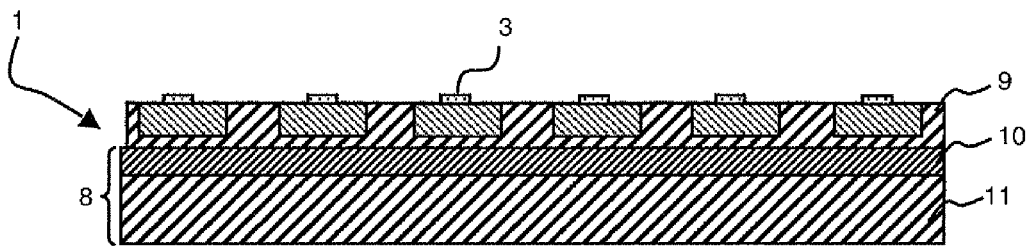
FIGS. 10, 11 and 12 illustrate a third embodiment of the assembly method.
Figure 11:
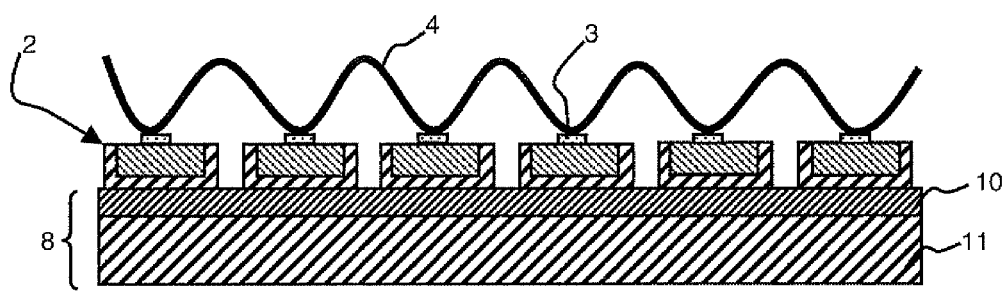
Figure 12:
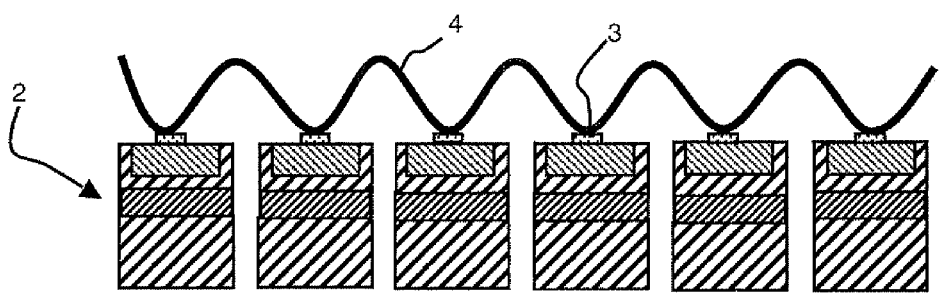

In a third embodiment illustrated in FIG. 10, the chips are integrated in a substrate 1 of silicon on insulator (SOI) type. The latter conventionally comprises an active substrate 9 arranged on a buried insulator 10 formed on a support substrate 11. Buried insulator 10 and support substrate 11 form a provisional support 8 of substrate 1. In similar manner to FIG. 8, in FIG. 11 the chips are partially separated at the level of active substrate 9 and ribbon 4 fixed to each of the chips. The chips can then be separated from provisional support 8 formed by the buried insulator and support substrate 11, for example by wet etching of buried insulator 10 in particular by means of hydrofluoric acid (FIG. 4). It is then also possible to separate provisional support 8 by splitting (not shown), the latter then being secured to the chip but no longer providing any mechanical function as in FIG. 12. As before, the chips remain connected to one another by means of ribbon 4 only.

The assembly obtained by the different methods described in the foregoing enables a plurality of chips each comprising at least one reception area 3 to be obtained. Chips 2 are then connected in series by electrically insulating flat ribbon 4 comprising a plurality of metallic patterns 5 electrically insulated from one another. Each pattern 5 forms at least a part of a flat antenna electrically connected at the level of at least one connection area 6 of said antenna to a corresponding reception area 3.

The second and third embodiments show chips comprising one reception area. These embodiments can naturally also comprise two reception areas (as in FIG. 6) or more at the level of each chip.

In general manner, a large number of chips 2 formed on one and the same substrate 1, i.e. the same wafer, can be connected in series to one another by at least one flexible ribbon 4 before being separated from one another at the level of substrate 1. An assembly of chips in the form of a flexible daisy-chain is thereby obtained that is able to be stored in the form of a reel or roll and be sliced as required at the level of inter-antenna space 7. The assembly is advantageously coated by a polymer or any other material providing protection against aggressions from the outside environment.

The invention is not limited to the embodiments described in the foregoing. In particular, different types of chips originating from different substrate can be connected by one and the same ribbon. Fabrication of an assembly can further use a combination of the features described in the foregoing in relation with the different embodiments.

Such a method enables RFID chips to be connected to their respective antennas in simple manner without damaging the chips when connection is performed. These chips can then be directly incorporated in paper sheets.

The invention claimed is:

1. A method for making an assembly of chips equipped with radiofrequency transmission-reception means, the method successively comprising:
   providing a substrate including a plurality of chips having at least one electrically conductive reception area;
   connecting the electrically conductive reception areas of the chips of the assembly in series by means of an electrically insulating flat ribbon having a plurality of metallic patterns electrically insulated from one another, one of the metallic patterns being electrically coupled to one of the electrically conductive reception areas so as to form a part of a flat antenna; and
   etching the substrate so as to separate the chips, the chips being mechanically connected to one another by the ribbon.

2. The method according to claim 1, wherein each chip includes two electrically conductive reception areas, and the ribbon at the level of each chip includes two patterns respectively electrically connected to the electrically conductive reception areas of said chip to form a dipolar antenna.

3. The method according to claim 1, wherein series connection is performed by unrolling the ribbon and by marking each connection area of the antenna corresponding to the reception area of the chip to be connected, each connection area being placed facing the corresponding electrically conductive reception area before bonding or ultrasonic welding.

4. The method according to claim 1, wherein the ribbon is a polymer film.

5. The method according to claim 1, wherein the ribbon is flexible and transparent.

6. The method according to claim 1, wherein the patterns are made of copper or aluminum.

7. The method according to claim 1, wherein the substrate includes a provisional support, the method further comprises:
   a step of partial slicing of the chips at the level of the substrate before connection of the electrically conductive reception areas in series, the provisional support being eliminated when separation of the chips is performed.

8. The method according to claim 1, wherein the assembly of chips is formed into a reel or a roll.

9. The method according to claim 1, wherein when connection in series of the electrically conductive reception areas of two adjacent chips is performed, the ribbon is stretched vertically with respect to the substrate between the two adjacent chips so that after the chips have been separated, the two adjacent chips are separated by a predefined distance.

10. The method according to claim 1, wherein the substrate is a silicon substrate and the chips are formed within the substrate.

11. The method according to claim 1, wherein one and the same ribbon connects the plurality of chips.

12. The method according to claim 1, wherein the chips are electrically insulated from one another.

* * * * *